(12) United States Patent
Ikeuchi et al.

(10) Patent No.: US 10,181,554 B2
(45) Date of Patent: Jan. 15, 2019

(54) PIEZOELECTRIC THIN FILM AND PIEZOELECTRIC THIN FILM DEVICE

(71) Applicant: Murata Manufacturing Co., Ltd., Nagaokakyo-shi, Kyoto-fu (JP)

(72) Inventors: Shinsuke Ikeuchi, Nagaokakyo (JP); Toshimaro Yoneda, Nagaokakyo (JP); Yoshitaka Matsuki, Nagaokakyo (JP); Naoyuki Endo, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 357 days.

(21) Appl. No.: 15/235,353

(22) Filed: Aug. 12, 2016

(65) Prior Publication Data

US 2016/0372654 A1    Dec. 22, 2016

Related U.S. Application Data

(63) Continuation of application No. PCT/JP2015/063119, filed on May 1, 2015.

(30) Foreign Application Priority Data

May 19, 2014 (JP) .................................. 2014-103353

(51) Int. Cl.
*H01L 41/187* (2006.01)
*H01L 41/047* (2006.01)
(Continued)

(52) U.S. Cl.
CPC ........ *H01L 41/1873* (2013.01); *C01G 33/006* (2013.01); *C23C 14/088* (2013.01);
(Continued)

(58) Field of Classification Search
CPC . H01L 41/1873; H01L 41/187; H01L 41/081; C01G 33/006; C23C 14/088
See application file for complete search history.

(56) References Cited

U.S. PATENT DOCUMENTS 8,450,911 B2    5/2013  Shibata et al.
8,847,470 B2    9/2014  Ikeuchi et al.
(Continued)

FOREIGN PATENT DOCUMENTS

JP   H11228227 A   8/1999
JP   2011109037 A  6/2011
WO   WO 2012020638 A1   2/2012

OTHER PUBLICATIONS

International Search Report issue for PCT/JP2015/063119, dated Aug. 4, 2015.
(Continued)

*Primary Examiner* — J. San Martin
(74) *Attorney, Agent, or Firm* — Arent Fox LLP

(57) ABSTRACT

A piezoelectric thin film contains potassium sodium niobate represented by general formula $(K_{1-x}Na_x)NbO_3$ and $CaTiO_3$, wherein the lattice spacing calculated from the diffraction peak of the (001) plane in an X-ray diffraction profile of the piezoelectric thin film is 3.975 Å or less, and the ratio $I_{101}/I_{001}$ of the diffraction peak intensity $I_{101}$ of the (101) plane to the diffraction peak intensity $I_{001}$ of the (001) plane in the X-ray diffraction profile of the piezoelectric thin film 3 satisfies the relationship $\log_{10}(I_{101}/I_{001}) \leq -2.10$.

6 Claims, 4 Drawing Sheets

(51) Int. Cl.
*H01L 41/08* (2006.01)
*C01G 33/00* (2006.01)
*C23C 14/08* (2006.01)

(52) U.S. Cl.
CPC .......... *H01L 41/047* (2013.01); *H01L 41/081* (2013.01); *H01L 41/187* (2013.01); C01P 2002/72 (2013.01); C01P 2002/74 (2013.01); C01P 2006/40 (2013.01)

(56) References Cited

U.S. PATENT DOCUMENTS

| | | |
|---|---|---|
| 2011/0121690 A1 | 5/2011 | Shibata et al. |
| 2013/0127293 A1 | 5/2013 | Ikeuchi et al. |
| 2014/0285069 A1* | 9/2014 | Suenaga ............. H01L 41/0805 310/363 |
| 2016/0365503 A1* | 12/2016 | Ikeuchi .................. C23C 14/08 |

OTHER PUBLICATIONS

S. Ikeuchi et al.; "Preparation of (K, Na) NbO3-CaTiO3 Film by RF Magnetron Sputtering"; 2014, IEEE International Ultrasonics Symposium Proceedings, Sep. 6, 2014, pp. 1578-1581.
Written Opinion of the International Searching Authority issue of PCT/JP2015/063119, dated Aug. 4, 2015.
Y. Lee et al.; "Electrical Properties of a 0.95 (Na0.5K0.5)NbO3-0.05CaTiO3 Thin Film Grown on a Pt/Ti/SiO2/Si Substrate"; Journal of the American Ceramic Society, Jun. 28, 2014, vol. 97, Issue 9, pp. 2892-2896.

* cited by examiner

PIEZOELECTRIC THIN FILM AND PIEZOELECTRIC THIN FILM DEVICE

CROSS REFERENCE TO RELATED APPLICATIONS

The present application is a continuation of International application No. PCT/JP2015/063119, filed May 1, 2015, which claims priority to Japanese Patent Application No. 2014-103353, filed May 19, 2014, the entire contents of each of which are incorporated herein by reference.

TECHNICAL FIELD

The present invention relates to a potassium sodium niobate based piezoelectric thin film and a piezoelectric thin film device that uses the piezoelectric thin film.

BACKGROUND ART

To date, much focus has been placed on piezoelectric materials composed of potassium sodium niobate having a perovskite crystal structure as lead-free piezoelectric magnetic compositions.

Japanese Unexamined Patent Application Publication No. 11-228227 discloses a piezoelectric magnetic composition containing a composition represented by general formula: $(1-n)(K1-x-yNaxLiy)m(Nb1-zTaz)O3-nM1M2O3$ as a primary component. In this publication m, n, x, y, and z are made to satisfy the ranges of $0.98 \leq m \leq 1.0$, $0 < n < 0.1$, $0.1 \leq x$, $y \leq 0.3$, $x+y < 0.75$, and $0 \leq z \leq 0.3$.

SUMMARY OF INVENTION

Technical Problem

Piezoelectric devices exhibiting good piezoelectric characteristics can be obtained by using the piezoelectric magnetic composition described in Japanese Unexamined Patent Application Publication No. 11-228227. However, in the case where this piezoelectric magnetic composition is made into a thin film, the piezoelectric characteristics may be degraded particularly at the time of low electric field driving.

It is an object of the present invention to provide a piezoelectric thin film and a piezoelectric thin film device, wherein degradation of the piezoelectric characteristics does not easily occur.

Solution to Problem

The present inventors have found that the above-described problems can be overcome by limiting the lattice spacing and the diffraction peak intensity in an X-ray diffraction profile of a piezoelectric thin film containing potassium sodium niobate represented by general formula (1): $(K1-xNax)NbO3$ and $CaTiO3$ to specific ranges.

That is, a piezoelectric thin film according to the present invention contains potassium sodium niobate represented by general formula (1): $(K1-xNax)NbO3$ and $CaTiO3$, wherein the lattice spacing calculated from the diffraction peak of the (001) plane in an X-ray diffraction profile of the piezoelectric thin film is 3.975 Å or less, and the ratio I101/I001 of the diffraction peak intensity I101 of the (101) plane to the diffraction peak intensity I001 of the (001) plane in the X-ray diffraction profile of the piezoelectric thin film satisfies the relationship $\log10(I101/I001) \leq -2.10$.

In a more preferred aspect of the invention, the ratio I101/I001 of the diffraction peak intensity I101 of the (101) plane to the diffraction peak intensity I001 of the (001) plane in the X-ray diffraction profile of the piezoelectric thin film preferably satisfies the relationship $\log10(I101/I001) \leq -2.95$.

In the piezoelectric thin film according to the present invention, the piezoelectric thin film containing potassium sodium niobate represented by general formula (1): $(K1-xNax)NbO3$ and $CaTiO3$ is preferably a piezoelectric thin film containing a composition represented by general formula (2): $(1-n)(K1-xNax)NbO3-nCaTiO3$, and x and n in general formula (2) are within the ranges of $0.56 \leq x \leq 0.73$ and $0.02 \leq n \leq 0.073$.

A piezoelectric thin film device according to one embodiment of the present invention includes a substrate, the piezoelectric thin film disposed on the substrate and first and second electrodes disposed so as to have the piezoelectric thin film interposed therebetween.

Advantageous Effects of Invention

According to the present invention, it is possible to provide a piezoelectric thin film and a piezoelectric thin film device, wherein degradation of the piezoelectric characteristics does not occur easily.

DESCRIPTION OF EMBODIMENTS

Specific embodiments according to the present invention will be described below with reference to the drawings so as to clarify the present invention.

(Piezoelectric Thin Film Device)

Figure 1:
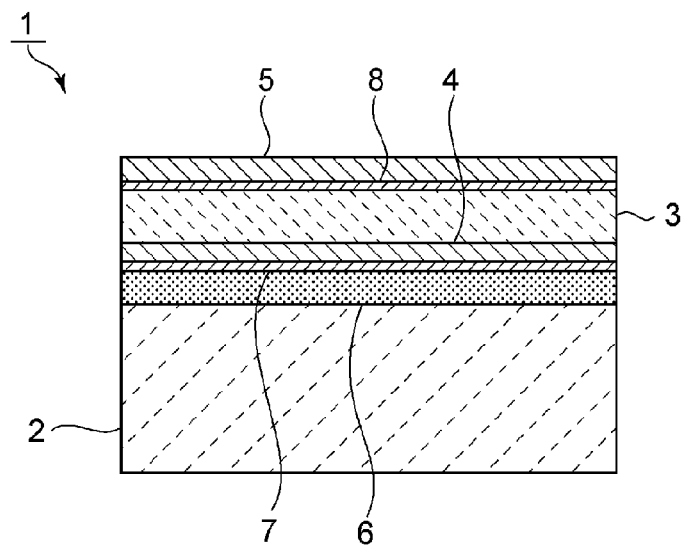
FIG. 1 is a schematic elevational cross-sectional view of a piezoelectric thin film device according to an embodiment of the present invention.

FIG. 1 is a schematic elevational cross-sectional view of a piezoelectric thin film device according to an embodiment of the present invention. A piezoelectric thin film device 1 includes a substrate 2 preferably composed of Si. In this regard, the substrate 2 may be composed of glass, SOI, other semiconductor materials or single crystal materials, or metal materials, e.g., stainless steel or titanium.

A SiO2 film 6 is preferably disposed on the substrate 2 but may be omitted. In the case where the SiO2 film is provided, a first electrode 4 is stacked on the SiO2 film 6 with a first adhesion layer 7 interposed therebetween. However, the SiO2 film 6 may be unnecessary in the present invention.

It is desirable that the first electrode 4 be composed of a material which is stable even in a high-temperature oxygen atmosphere. Examples of such a material include noble metal materials, e.g., Pt, Au, and Ir, and electrically conductive oxide materials. In the present embodiment, the first electrode 4 is composed of Pt and the first adhesion layer 7 is preferably composed of Ti. The first adhesion layer 7 may also be composed of a material, e.g., TiOx, that functions as the adhesion layer.

A piezoelectric thin film 3 is stacked on the first electrode 4 and contains potassium sodium niobate represented by general formula (1): $(K_{1-x}Na_x)NbO_3$ and $CaTiO_3$.

A second electrode 5 is disposed on the piezoelectric thin film 3. Specifically, the second electrode 5 is stacked on the piezoelectric thin film 3 with a second adhesion layer 8 interposed therebetween. The second electrode 5 is preferably composed of Pt. However, the second electrode 5 may be composed of other appropriate electrically conductive materials. The second adhesion layer 8 is preferably composed of Ti. The second adhesion layer 8 may also be composed of other materials, e.g., TiOX, that function as the adhesion layer.

While preferred, the first adhesion layer 7 and the second adhesion layer 8 may be omitted. That is, the piezoelectric thin film 3 may be interposed directly between the first electrode 4 and the second electrode 5.

(Piezoelectric Thin Film)

As described above, the piezoelectric thin film according to the present invention contains potassium sodium niobate (KNN) represented by general formula (1): $(K_{1-x}Na_x)NbO_3$ and $CaTiO_3$. A piezoelectric thin film containing a composition (KNN-CT) represented by general formula (2): $(1-n)(K_{1-x}Na_x)NbO_3-nCaTiO_3$ is suitable for use as the piezoelectric thin film containing KNN and $CaTiO_3$.

In the present invention, the lattice spacing calculated from the diffraction peak of the (001) plane in the X-ray diffraction profile of the piezoelectric thin film is 3.975 Å or less. Consequently, generation of a heterogeneous phase other than the perovskite phase is suppressed. In this regard, the above-described X-ray diffraction profile is measured by performing an out-of-plane $2\theta/\omega$ scan.

Also, in the present invention, the ratio I101/I001 of the diffraction peak intensity I101 of the (101) plane to the diffraction peak intensity I001 of the (001) plane in the X-ray diffraction profile of the piezoelectric thin film satisfies the condition $\log 10(I101/I001) \leq -2.10$. Therefore, regarding the piezoelectric thin film according to the present invention, the piezoelectric characteristics are not easily degraded even at the time of low electric field driving. The reason for this will be described specifically with reference to FIG. 2 and FIG. 3.

Figure 2:
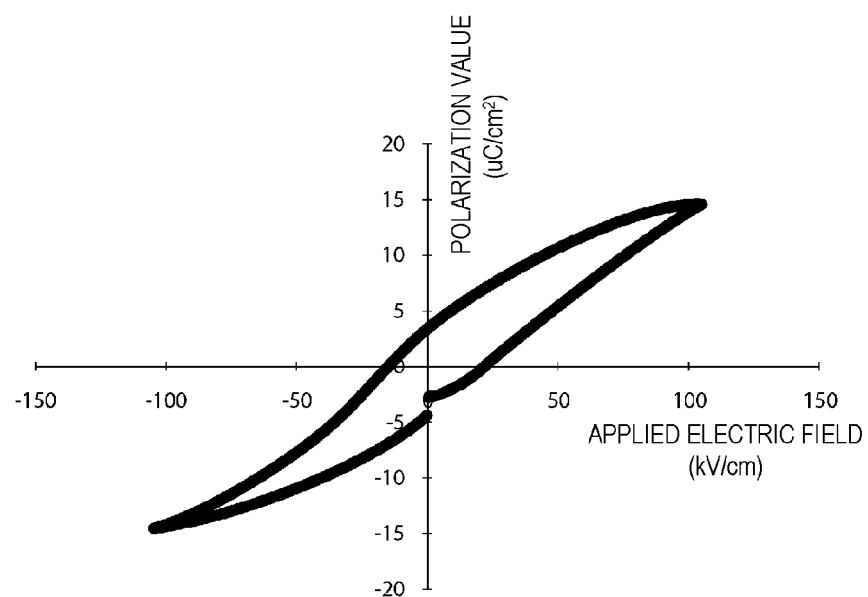
FIG. 2 is a diagram showing the P-E hysteresis curve of a piezoelectric thin film containing KNN-CT in the related art.

When the ferroelectricity of a piezoelectric thin film in a piezoelectric thin film device, including, in order, a first electrode, a piezoelectric thin film containing KNN-CT, and a second electrode it exhibits characteristics corresponding to the P-E hysteresis curve of FIG. 2. The above-described P-E hysteresis can be explained on the basis of the following mechanism.

Initially, when an electric field is applied in the direction from the second electrode toward the first electrode, that is, in the positive direction, and the strength of the electric field increases, polarization occurs sequentially from domains, in which polarization in the positive direction occurs easily, among a plurality of domains present in the piezoelectric thin film. As the strength of the applied electric field further increases, the polarization state in the positive direction is saturated.

Subsequently, as the applied electric field is weakened from the saturated state, the polarized state is released sequentially from the domain in which polarization reversal does not easily occur. As the electric field applied in the negative direction is further strengthened, the polarization of the entirety of the piezoelectric film becomes 0. The electric field at the time when the polarization of the entirety of the piezoelectric film becomes 0 is referred to as a coercive electric field. Usually, the coercive electric field in the case where the polarization occurs in the positive direction takes on a negative value, and the coercive electric field in the case where the polarization occurs in the negative direction takes on a positive value.

As the negative electric field is further strengthened beyond the coercive electric field, the polarized state in the negative direction is saturated. In this regard, the case where the electric field in the negative direction is weakened and the electric field in the positive direction is strengthened is explained in the same manner as in the case where the electric field in the positive direction is weakened and the electric field in the negative direction is strengthened.

As shown in FIG. 2, the P-E hysteresis curve of a piezoelectric thin film containing KNN-CT in the related art, has two almost symmetrical, positive and negative, coercive electric fields, and the remanent polarization of the piezoelectric thin film exhibits a very low value compared with the saturated polarization value. That is, even in the case where polarization is initially arranged in some direction, the polarization value decreases at the time of return to a region to which a low electric field or no electric field is applied. Therefore, regarding the piezoelectric thin film containing KNN-CT in the related art, the piezoelectric characteristics are degraded easily in the region to which a low electric field or no electric field is applied.

Figure 3:
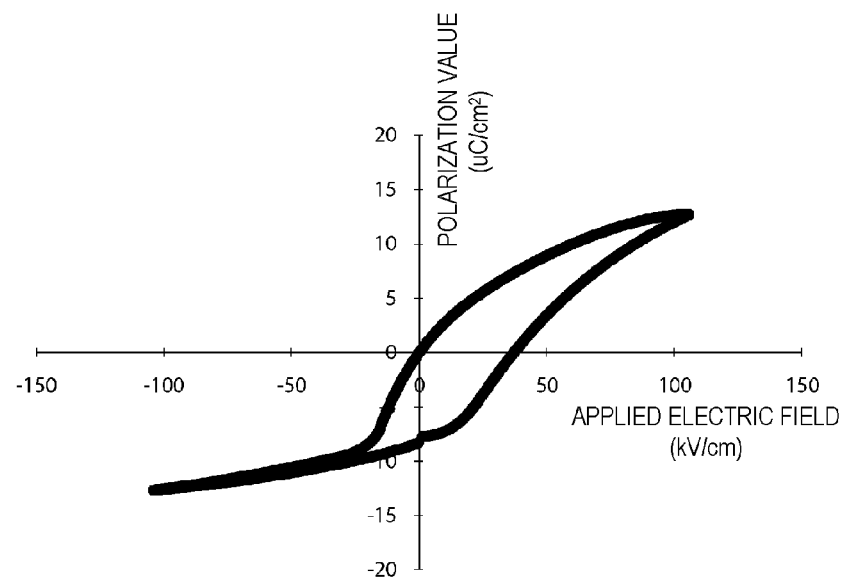
FIG. 3 is a diagram showing the P-E hysteresis of a piezoelectric thin film according to an embodiment of the present invention.

On the other hand, in the present invention, the peak intensity ratio I101/I001 in the X-ray diffraction profile satisfies $\log 10(I101/I001) \leq -2.10$, and therefore, the P-E hysteresis curve shown in FIG. 3, on which the coercive electric fields that are usually present in the symmetrical manner with respect to positive and negative deviate in the positive direction, is exhibited. That is, a negative remanent polarization value is large in the piezoelectric thin film of the present invention, Consequently, the piezoelectric characteristics of the piezoelectric thin film according to the present invention are not easily degraded even in the region to which a low electric field or no electric field is applied.

As shown in the experimental example described later, in the present invention, deviation in the positive direction is further increased, that is, the peak intensity ratio I101/I001 of the X-ray diffraction profile is made to satisfy the relationship $\log 10(I101/I001) \leq -2.95$, and thereby, each of the coercive electric fields that are usually present in a symmetrical manner with respect to positive and negative can take on a positive value. That is, spontaneous polarization in the negative direction can be caused by further increasing the deviation in the positive direction.

In this case, at the time of film formation, the piezoelectric thin film is polarized in the direction inverse to the direction of deviation of the coercive electric field. Therefore, the polarization step, which is necessary at the time of film formation in the related art, can be omitted.

Also, a device including the piezoelectric thin film is usually mounted by reflow of solder at a temperature, at which the polarization of a piezoelectric magnetic composition disappears, that is, about 300° C. However, in the case where spontaneous polarization in the negative direction occurs, as described above, the piezoelectric characteristics are not easily degraded after reflow of solder.

In the present invention, x and n in general formula (2): $(1-n) (K_{1-x}Na_x)NbO_3-nCaTiO_3$ are preferably within the ranges of $0.56 \leq x \leq 0.73$ and $0.02 \leq n \leq 0.073$.

In the case where the values of x and n are within the above-described ranges, heterogeneous phases can be all the more reduced and the piezoelectric characteristics can be enhanced all the more effectively.

The piezoelectric thin film according to the present invention will be described below in more detail with reference to specific experimental examples.

Initially, a first adhesion layer composed of Ti and a first electrode composed of Pt are formed on a Si substrate provided with a SiO2 film in this order.

Thereafter, a piezoelectric thin film containing KNN-CT is formed on the first electrode. In this regard, a buffer layer for controlling the orientation and the stress may be disposed between the first electrode and the piezoelectric thin film. Examples of materials for forming the buffer layer include perovskite oxide materials, e.g., LaNiO3 and SrRuO3, and potassium sodium niobate (KNN)-based thin films formed at low temperatures.

The piezoelectric thin film is formed by RF magnetron sputtering. Regarding a target, a target containing KNN-CT is used, where x, m, and n satisfy $0.47 \leq x \leq 0.65$, $m=1$, and $0.02 \leq n \leq 0.043$, respectively.

As described above, when the piezoelectric thin film is formed, a single target may be used or a plurality of targets may be used so as to perform sputtering at the same time for obtaining a predetermined composition.

The substrate heating temperature is set at 500° C. to 650° C. in terms of apparatus set temperature and sputtering is performed in a mixed gas atmosphere of Ar and O2. The ratio O2/(Ar+O2) relationship of Ar and O2 in the mixed gas is adjusted to about 1 to 10%. The sputtering pressure is set at 0.3 Pa. In addition, the cathode power per unit area is set at 2.5 W/cm2 and the film formation time is adjusted such that the film thickness of the resulting piezoelectric thin film becomes 1 to 3 µm.

Meanwhile, it is known that if production is performed by sputtering, the amount of loss of K is 30% at maximum during formation of the piezoelectric thin film. In such a case, the composition of the resulting piezoelectric thin film deviates from the target composition by an amount corresponding to the loss of K.

Specifically, in the case where a target, in which the value of (K+Na)/Nb, that is, the value of m, is 1, is used, the value of m of the resulting piezoelectric thin film is $0.85 \leq m \leq 0.90$. Also, the values of x and n of the resulting piezoelectric thin film are $0.56 \leq x \leq 0.73$ and $0.02 \leq n \leq 0.043$, respectively.

Subsequently, the piezoelectric thin film device is obtained by forming a second adhesion layer composed of Ti and a second electrode composed of Pt on the piezoelectric thin film in this order. The piezoelectric thin film may be subjected to a post annealing step for heating at a predetermined temperature, that is, an additional heating step, before the second electrode is formed or after the second electrode is formed.

The crystal state and the ferroelectric characteristics of the piezoelectric thin film constituting the thus produced piezoelectric thin film device are measured.

Figure 4:
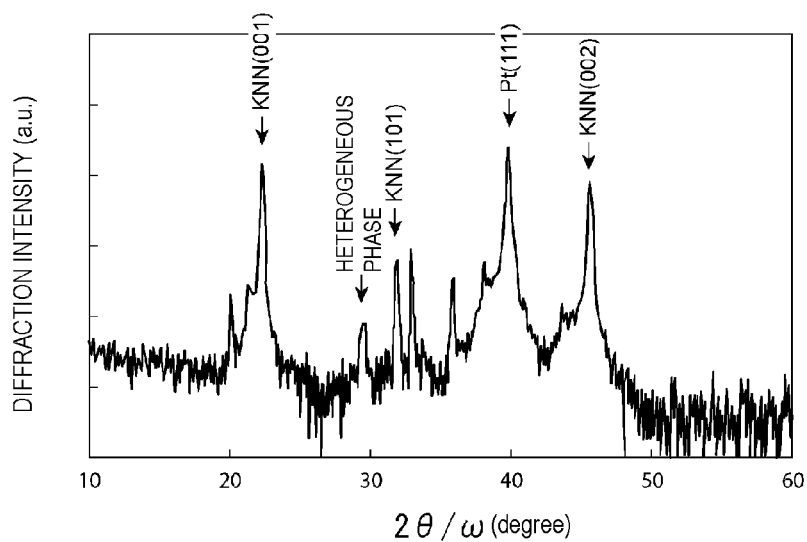
FIG. 4 is a diagram showing an X-ray diffraction profile of a piezoelectric thin film produced in an experimental example.

FIG. 4 is a diagram showing an X-ray diffraction profile of the so produced piezoelectric thin film. In this regard, the X-ray diffraction profile was measured by an out-of-plane $2\theta/\omega$ scan with an X-ray diffractometer (Model "ATX-E" produced by Rigaku Corporation) that used a CuKα line ($\lambda=0.154056$ nm). Also, in FIG. 4, Miller indices are expressed under the assumption that the crystal structure of KNN-CT contained in the piezoelectric thin film is a pseudo-cubic structure.

As is clear from FIG. 4, a diffraction peak of the (001) plane of a pseudo-cubic structure of KNN-CT is present at $2\theta/\omega=22°$ to $23°$. Also, it is clear that a diffraction peak of the (101) plane of the pseudo-cubic structure of KNN-CT is present at $2\theta/\omega=31.5°$ to $32.5°$.

The lattice spacing was calculated from the diffraction angle of the diffraction peak of the (001) plane. The lattice spacing of the (001) plane was 3.952 Å to 3.994 Å.

In addition, as is clear from FIG. 4, a peak resulting from a heterogeneous phase other than the perovskite phase of KNN-CT is present at $2\theta/\omega=29°$ to $30°$.

Figure 5:
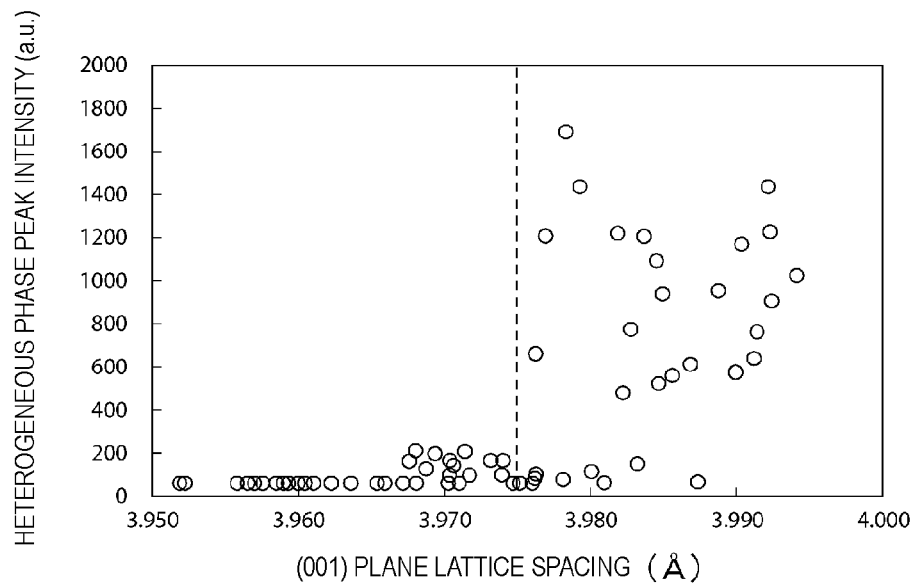
FIG. 5 is a diagram showing the relationship between the lattice spacing of the (001) plane and the peak intensity of a heterogeneous phase in the X-ray diffraction profile shown in FIG. 4.

FIG. 5 is a diagram showing the relationship between the lattice spacing of the (001) plane and the peak intensity of the heterogeneous phase in the X-ray diffraction profile shown in FIG. 4. In this regard, in the case where the peak intensity of the heterogeneous phase was too weak and the peak was not observed, that is, in the case of a good quality piezoelectric thin film, the intensity of the background was measured as the peak intensity of the heterogeneous phase.

As is clear from FIG. 5, in the case where the lattice spacing of the (001) plane is 3.975 Å or less, the peak intensity of the heterogeneous phase is reduced. That is, it is clear that generation of a heterogeneous phase other than the perovskite phase is suppressed.

Then, the ferroelectric characteristics of the sample exhibiting the lattice spacing of the (001) plane of 3.975 Å or less in FIG. 5, that is, exhibiting a small heterogeneous phase content, were measured. Specifically, a P-E hysteresis measurement was performed, where an electric field was applied from the second electrode to the first electrode and changes in the polarization value were measured. At that time, regarding the electric field, an electric field of 106 kV/cm at maximum was applied as a triangular wave of 100 Hz in the positive direction and the negative direction sequentially. In this regard, a pulse electric field of 106 kV/cm for polarization was applied before sweeping of the above-described triangular wave.

In the thus obtained P-E hysteresis, the value of the coercive electric field Ec− present on the negative electric field side of the two above-described coercive electric fields, at which the polarization values were 0, was −17.2 to 3.7 kV/cm. On the other hand, the value of the coercive electric field Ec+ present on the positive electric field side was 12.5 to 38.4 kV/cm. Meanwhile, the amount of deviation, that is, (Ec++Ec−)/2, was calculated from the resulting Ec− and Ec+, and the relationship with the ratio I101/I001 of the diffraction peak intensity I101 of the (101) plane to the diffraction peak intensity I001 of the (001) plane in the X-ray diffraction profile shown in FIG. 4 was determined.

Figure 6:
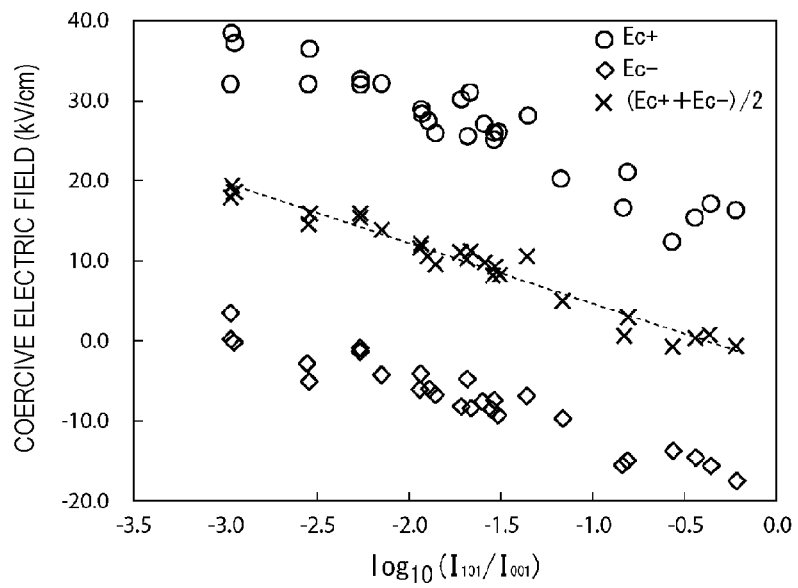
FIG. 6 is a diagram showing the relationship between the ratio I101/I001 of the diffraction peak intensity I101 of the (101) plane to the diffraction peak intensity I001 of the (001) plane in the X-ray diffraction profile shown in FIG. 4 and the coercive electric field.

FIG. 6 is a diagram showing the relationship between $\log_{10}(I101/I001)$ and the resulting coercive electric field.

As is clear from FIG. 6, as I101/I001 decreases, that is, as the degree of orientation of the (101) plane decreases and the degree of orientation of the (001) plane increases, Ec− and Ec+ are shifted in the positive direction.

Also, there is a linear correlation between the amount of deviation, that is, (Ec++Ec−)/2, and I101/I001, and it is clear that as I101/I001 decreases, the amount of deviation increases.

Figure 7:
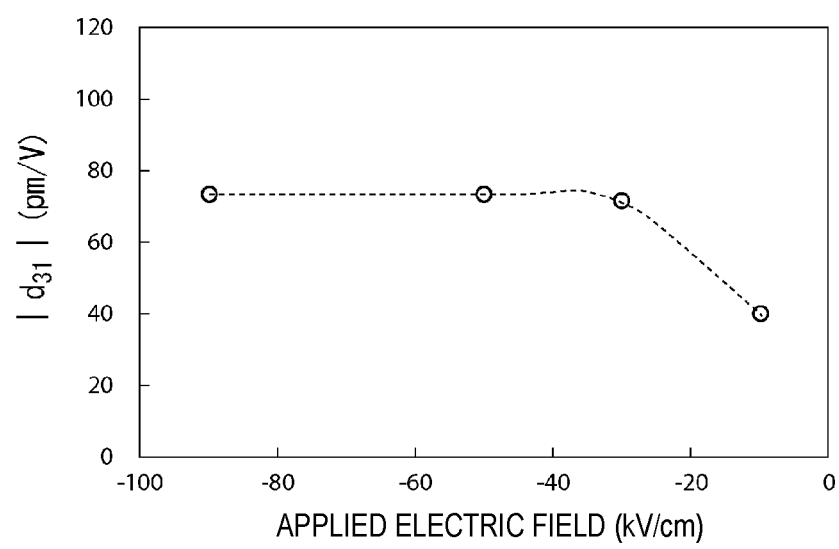
FIG. 7 is a diagram showing the applied electric field dependence of the piezoelectric constant |d31| of a piezoelectric thin film exhibiting no deviation in the coercive electric field.

FIG. 7 is a diagram showing the applied electric field dependence of the piezoelectric constant |d3| of a piezoelectric thin film exhibiting no deviation in the coercive electric field. In this regard, an open-sided unimorph cantilever including the piezoelectric thin film and a Si substrate was produced, and the piezoelectric constant |d31| was determined from the displacement of the end of the unimorph cantilever when an electric field was applied in the thickness direction of the above-described piezoelectric thin film.

In this regard, the method for measuring the piezoelectric constant |d3| in the present experimental example is the same as the method described in Japanese Unexamined Patent Application Publication No. 2012-019050. In addition, when the piezoelectric constant |d3| was calculated, the value adopted as Young's modulus of the piezoelectric thin film was the same value as Young's modulus of the bulk KNN.

As is clear from FIG. 7, sufficiently high piezoelectric constants |d3| were obtained when the absolute value of the applied electric field was in the range of 30 kV/cm or more. On the other hand, the piezoelectric constant |d3| was very small at the time of low electric field driving, where the absolute value of the applied electric field was about 10 kV/cm.

In the piezoelectric thin film device that uses the piezoelectric thin film, in many cases, the piezoelectric thin film is driven at a low electric field. The upper limit of the driving voltage obtained from common circuits and the like is about 5 V, and if the film thickness of the piezoelectric thin film at that time is specified as 3 μm, an applicable electric field is about 17 kV/cm.

Then, if the coercive electric field of the piezoelectric thin film can deviate by 13 kV/cm or more, that is, if the amount of deviation of the piezoelectric thin film can be specified as 13 kV/cm or more, even when the electric field applicable from the circuit is 17 kV/cm, the piezoelectric thin film can be driven as if an electric field of 30 kV/cm is applied.

As is clear from FIG. 6, in order to specify the amount of deviation, that is, (Ec++Ec−)/2, as 13 kV/cm or more, I101/I001 has to satisfy the range of log10(I101/I001) ≤ −2.10.

Therefore, in the present invention, degradation of the piezoelectric characteristics at the time of low electric field driving can be suppressed by making the ratio of the diffraction peak intensity I101 to the diffraction peak intensity I001 of the (001) plane in the X-ray diffraction profile of the piezoelectric thin film satisfy the range of log10(I101/I001) ≤ −2.10.

Also, as is clear from FIG. 6, when log10(I101/I001) decreases, Ec−>0 is held in the range of log10(I101/I001) ≤ −2.95. In this case, the piezoelectric thin film spontaneously polarizes in the negative direction easily.

Therefore, in the case where the peak intensity ratio I101/I001 in the X-ray diffraction profile satisfies the range of log10(I101/I001) ≤ −2.95, the poling step can be omitted. Also, in this case, polarization does not disappear even in the reflow step at a high temperature and, therefore, degradation of the piezoelectric characteristics after reflow can be all the more suppressed.

REFERENCE SIGNS LIST 1 piezoelectric thin film device
2 substrate
3 piezoelectric thin film
4, 5 first electrode, second electrode
6 $SiO_2$ film
7, 8 first adhesion layer, second adhesion layer

The invention claimed is:

1. A Piezoelectric thin film comprising potassium sodium niobate represented by a general formula $(K_{1-x}Na_x)NbO_3$ and $CaTiO_3$ and having:
   a lattice spacing calculated from the diffraction peak of the (001) plane in an X-ray diffraction profile of the piezoelectric thin film of 3.975 Å or less, and
   a ratio $I_{101}/I_{001}$ of the diffraction peak intensity $I_{101}$ of the (101) plane to the diffraction peak intensity $I_{001}$ of the (001) plane in the X-ray diffraction profile of the piezoelectric thin film which satisfies the following relationship: $\log_{10}(I_{101}/I_{001}) \leq -2.10$.

2. The piezoelectric thin film according to claim 1, wherein the ratio $I_{101}/I_{001}$ satisfies the following relationships: $\log_{10}(I_{101}/I_{001}) \leq -2.95$.

3. The piezoelectric thin film according to claim 1 wherein the piezoelectric thin film containing potassium sodium niobate represented by the general formula (1): $(K_{1-x}Na_x)NbO_3$ and $CaTiO_3$ is a piezoelectric thin film containing a composition represented by a general formula $(1-n)(K_{1-x}Na_x)NbO_3-nCaTiO_3$, wherein x and n are within the ranges of $0.56 \leq x \leq 0.73$ and $0.02 \leq n \leq 0.073$.

4. A piezoelectric thin film device comprising:
   a substrate;
   the piezoelectric thin film disposed on the substrate, according to claim 1; and
   first and second electrodes disposed so as to have the piezoelectric thin film interposed therebetween.

5. A piezoelectric thin film device comprising:
   a substrate;
   the piezoelectric thin film disposed on the substrate, according to claim 2; and
   first and second electrodes disposed so as to have the piezoelectric thin film interposed therebetween.

6. A piezoelectric thin film device comprising:
   a substrate;
   the piezoelectric thin film disposed on the substrate, according to claim 3; and
   first and second electrodes disposed so as to have the piezoelectric thin film interposed therebetween.

* * * * *